United States Patent [19]
Lacey

[11] Patent Number: 5,638,322
[45] Date of Patent: Jun. 10, 1997

[54] APPARATUS AND METHOD FOR IMPROVING COMMON MODE NOISE REJECTION IN PSEUDO-DIFFERENTIAL SENSE AMPLIFIERS

[75] Inventor: Timothy M. Lacey, Cupertino, Calif.

[73] Assignee: Cypress Semiconductor Corp., San Jose, Calif.

[21] Appl. No.: 503,988

[22] Filed: Jul. 19, 1995

[51] Int. Cl.$^6$ .................................................. G11C 11/34
[52] U.S. Cl. .............................. 365/185.2; 365/185.21; 365/207; 365/208
[58] Field of Search ............................. 365/185.2, 185.21, 365/207, 208

[56] References Cited

U.S. PATENT DOCUMENTS

| | | |
|---|---|---|
| 4,301,518 | 11/1981 | Klaas . |
| 4,713,797 | 12/1987 | Morton et al. . |
| 4,763,026 | 8/1988 | Tsen et al. ........................... 365/207 |
| 4,766,333 | 8/1988 | Mobley . |
| 4,884,241 | 11/1989 | Tanaka et al. . |
| 4,978,905 | 12/1990 | Hoff et al. . |
| 4,999,813 | 3/1991 | Ohtsuka et al. . |
| 5,010,518 | 4/1991 | Toda . |
| 5,117,394 | 5/1992 | Amin et al. . |
| 5,144,171 | 9/1992 | Huard . |
| 5,218,570 | 6/1993 | Pascucci et al. . |
| 5,245,574 | 9/1993 | Frary et al. . |
| 5,258,959 | 11/1993 | Dallabora et al. . |
| 5,398,203 | 3/1995 | Prickett, Jr. . |

OTHER PUBLICATIONS

A.S. Sedra and K.C. Smith, "*Microelectronic Circuits,*" Holt, Rinehart and Winston, pp. 776–780.

*Primary Examiner*—David C. Nelms
*Assistant Examiner*—F. Niranjan
*Attorney, Agent, or Firm*—Blakely, Sokoloff, Taylor & Zafman LLP

[57] ABSTRACT

A pseudo-differential sense amplifier with improved common mode noise rejection is disclosed. The sense amplifier is connected to a memory cell via an array path and generates an output signal indicative of the state of the memory cell. The sense amplifier includes an array load device connected via an array node to the array path, a reference load device connected via a reference node to a reference path, a differential stage having a first input connected to the reference node, a second input connected to the array node and an output generating the output signal. The sense amplifier further includes a balancing device, connected to the reference node, for compensating a change in signal, caused by a noise event, at the array node and, thus reducing a delay in the response of the sense amplifier when a transition in the state of the cell occurs.

27 Claims, 10 Drawing Sheets

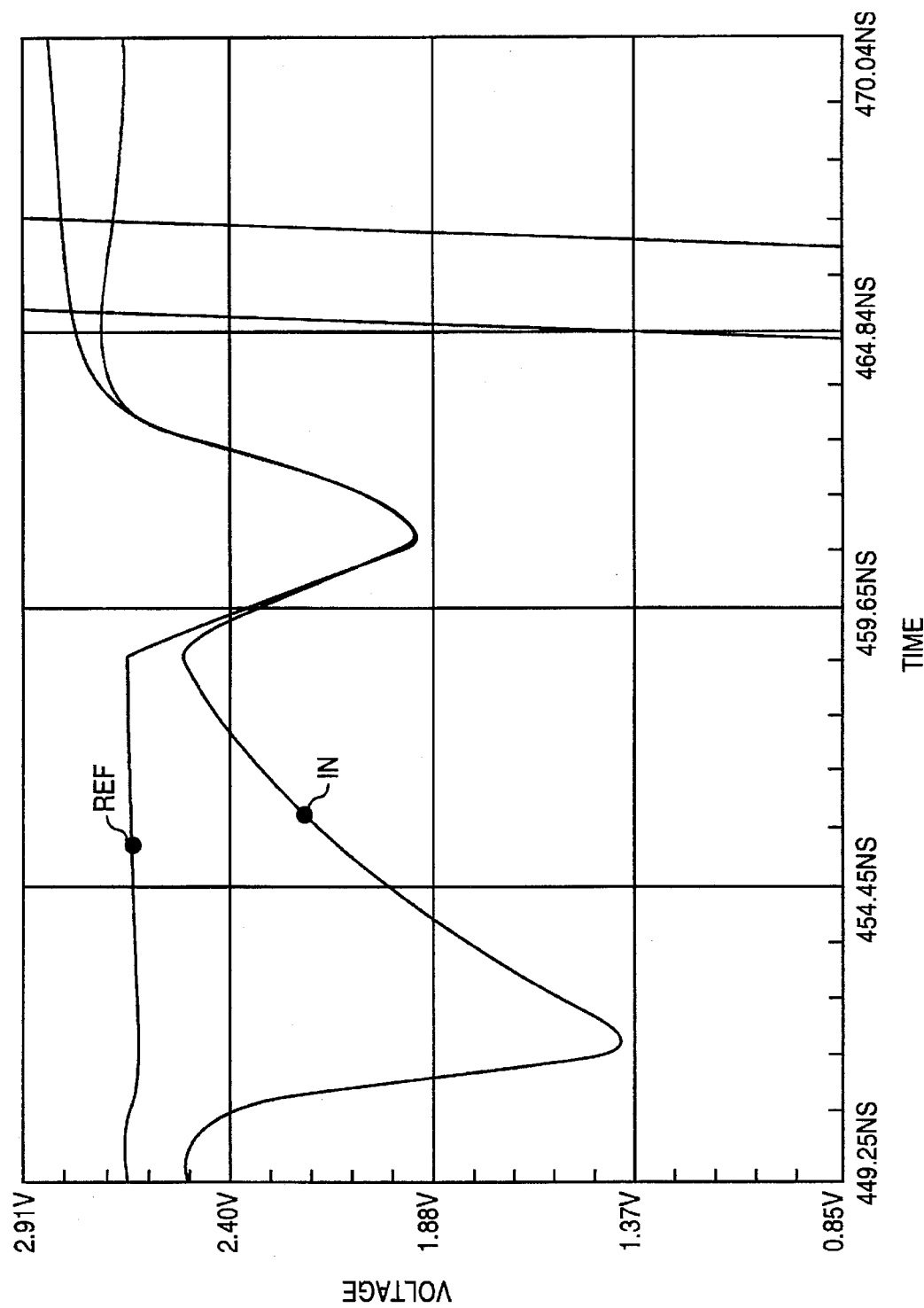

APPARATUS AND METHOD FOR IMPROVING COMMON MODE NOISE REJECTION IN PSEUDO-DIFFERENTIAL SENSE AMPLIFIERS

BACKGROUND OF THE INVENTION

1. Field of the Invention

The present invention relates to semiconductor memory devices and more specifically, to a pseudo-differential sense amplifier for reading memory cells.

2. Description of the Related Art

Sense amplifiers are used to detect small differential signals generated by memory cells and to shift the voltage levels of the memory cell output signals to a magnitude compatible with output circuitry in a memory chip. One type of integrated circuit memory, that can be connected to a sense amplifier, is the erasable programmable read-only memory ("EPROM"). EPROMs frequently use memory cells that have electrically isolated gates (floating gates) such as an enhancement-type n-channel metal-oxide semiconductor field effect transistor (MOSFET) with two gates made of polysilicon material, otherwise known as FAMOS (Floating Gate Avalanche Injection Metal Oxide Semiconductor device). In FAMOS technology, information is stored in the memory cells in the form of charge on the floating gates. Such memory cells are programmed by placing a charge on the floating gates. The EPROM can be programmed by a user, and once programmed, the EPROM retains its data until erased.

The EPROM comprises memory cells logically organized by an array of rows and columns. Typically, the rows represent word lines and the columns represent bit lines. By selecting the appropriate word line and bit line, each individual cell may be programmed or read. During the programming operation a given memory cell or cells are selected for programming, then a voltage is applied to the control gate of each memory device (e.g. a FAMOS device). A programming voltage is applied to the bit line of each selected memory cell. The programming voltage generates a programming current flowing through the selected bit line, thus programming the memory cell or cells. The FAMOS memory cell, thus, can be in a programmed state, the memory cell not conducting current or in a "not programmed" state, the cell conducting current.

Memory cell sizes and the corresponding memory cell output current is reduced as array density is increased to maintain cost effectiveness. As a result, sense amplifiers are required to be very sensitive to small current changes coming from the memory cells. Increased transistor density causes a reduction in speed and memory cell output current. That is, increased transistor density entails larger resistors and capacitors distributed among the rows and columns of the cell matrix of the device, which in turn increases the RC time constants. Increased RC time constants and reduced memory cell output current result in slower device speeds. There are at least two particular factors which limit the speed of the device. One of these factors is the delay related to the RC time constant of the row in the cell matrix—R being the resistance of the polysilicon conductor, and C the capacitance of the gates of the cells connected in parallel to the row. Another factor is the delay related to the capacitance of the column in the cell matrix, i.e., of the drain junctions of the connected cells and amount of memory cell output current necessary to charge the column.

In pseudo-differential sense amplifiers the speed can also be affected by a noise event at the $V_{CC}$ supply voltage or at the $V_{SS}$ supply voltage. More specifically, a delay in the response of the sense amplifier can be caused during a glitch to the $V_{SS}$ or $V_{CC}$ supply, one of the supply voltages, $V_{SS}$ or $V_{CC}$, failing to follow a change in the other supply voltage. If a noise event, affecting $V_{SS}$ or $V_{CC}$, occurs during a sense amplifier transition, a speed push out will be experienced. A speed push-out can be defined as a delay in the response of the sense amplifier and the reasons for its occurrence can be understood in conjunction with FIG. 1.

FIG. 1 illustrates a conventional pseudo-differential sense amplifier including differential stage 2 having two inputs (4, 6) and one output 8, an array path 10, and a reference path 12. The array path 10 is connected to the array load device $M_1$ via an array node IN. In the particular configuration illustrated in FIG. 1, transistor M1 is an N-MOS transistor having the gate and the drain connected to the supply voltage $V_{CC}$, and the source connected to the array node IN which is connected to the input 6 of the differential stage amplifier 2. The differential stage is cascoded to the output of cascode transistor $M_{CA}$ which is connected to the array node IN of the array path 10. The cascode transistor $M_{CA}$, in this particular configuration illustrated in FIG. 1, is an N-MOS transistor having the drain connected to the array node IN, the gate connected to a cascode reference voltage 18, and the source connected to the node DRA. Furthermore, an array memory cell MRA is connected to the bit line array node BLA via a bit line 20. A bit line data signal is fed to the array node IN via the bit line 20, the bit line array node BLA, the column decode transistor $M_{CDA}$ and the cascode transistor $M_{CA}$. The above-described configuration of the array path connected to the array load device and to the array memory cell provides an input signal to the array node IN. Similarly, a reference signal is generated through a reference path 12 at the reference node REF, as it will be explained in the following paragraph. The differential stage 2 receives the array input signal and the reference input signal, and generates in response sense amplifier output signal OUT. Differential stage 2 includes P-MOS transistors $M_{CM1}$ and $M_{CM2}$ connected in a current mirror configuration. $M_{CM1}$ is coupled at its drain to the drain of transistor $M_{D1}$, while $M_{CM2}$ is coupled at its drain to the drain of transistor $M_{D2}$. The sources of transistors $MD_2$ and $MD_1$ are connected to current source transistor $M_{CS}$ which is an N-MOS transistor in this particular example.

With respect to the reference path 12, this path and the array path are, generally, symmetrically designed from the cascode device down to improve process compensation and noise immunity. The reference path includes the reference load device $M_2$ having a channel width 2W, substantially double the width of the channel of the array load device $M_1$. Consequently, the impedance of the reference load device is substantially half the impedance of the array load device. The reference load device $M_2$, in the particular embodiment illustrated in FIG. 1, is an N-MOS transistor having the gate and the drain connected to $V_{CC}$ and the source connected to a reference node REF. The reference node REF 16 is coupled to the second input 4 to the differential stage 2. This input is connected to the gate of transistor $MD_1$ of the differential stage 2. The reference path further includes a cascode reference transistor $M_{CR}$ having the drain connected to the reference node, the gate connected to a cascode reference voltage 18 and the source connected to the node DRR. Furthermore, the node DRR is connected via transistor $M_{CDR}$, the node BLR, and a dummy bit line of the dummy memory cell, to a dummy memory cell MRR constructed similarly to the array memory cell. Finally, reference dummy cell MRR is connected to a voltage supply source $V_{SS}$. A reference signal is, thus, generated at the node REF connected to the second input 4 of the differential stage 2. A high voltage level is seen at array node IN when reading a programmed cell, while a low voltage level is seen when reading a "not programmed" cell. The sizes of the load devices M1 and M2 are chosen such that the reference voltage REF falls in between the high and the low voltage level of the array node IN.

The prior art pseudo-differential sense amplifier illustrated in FIG. 1, is designed so that the reference path matches the array path as close as possible, in order to maximize process compensation, noise margin, speed balancing, etc. A competing consideration in designing a pseudo-differential sense amplifier is centering the reference voltage between the high and the low voltages of the array path. To achieve such design one has to give up current gain on the reference side by making the reference load device of the reference path less resistive. This can be seen in FIG. 1 which shows a reference load device M2 with a channel having a width 2W as opposed to the width W of the array load device. The consequence of this design is that a less resistive reference load device causes less current gain on the reference path. A noisy event that causes a current change in both the array and reference paths will, thus, affect the array path more than the reference path.

As explained above, a common occurrence of a noise event affecting the performance of the sense amplifier, takes place during a noise event to the $V_{SS}$ supply or the $V_{CC}$ supply. In this case, the asymmetric distribution of resistive elements in the array and reference paths, due mostly to the asymmetrical load devices, will cause the reference node to track more closely to the $V_{CC}$ supply voltage since this reference path is more tightly coupled to $V_{CC}$. By contrast, a noise-event at $V_{SS}$ will affect the array node more than the reference node. Consequently, if a noise event occurs during a sense amplifier transition, a speed push-out will be experienced due to the fact that the "IN" voltage and the "REF" voltage signals will not follow each other closely, as in the absence of noise, or as in the case where the array and reference load devices would be symmetrically designed.

With respect to the memory cell, when the memory cell is in a "not programmed" state, cell current flows through the array path, thereby causing the voltage seen at the node IN to be at a low level. A cell having a programmed state, however, will prevent current from flowing, thereby causing the voltage seen at the IN node to be at a high level. Consequently, the IN node will have a low or a high voltage value. Because symmetry is required to achieve process compensation and noise immunity, a dummy reference cell, or the equivalent parasitic components, is/are required in the reference path. However, since the reference cell cannot be turned on halfway, in order to achieve the centering of the reference voltage, the dummy cell will have to fully conduct. To complicate things more, if the loads used in the reference and the array paths had the same impedance, one could not get a differential sensing considering the substantial symmetrical configuration of the array and reference paths.

The design of prior art sense-amplifiers suffers of flaws with regard to noise events due to the difference in the impedances of the loads. For example, by having a less resistive reference load device, the reference node REF will be more tightly coupled to $V_{CC}$ as opposed to the array node IN which is separated from $V_{CC}$ by a higher resistance. Moreover, a noise event at $V_{CC}$ or $V_{SS}$ will be translated into a current change in the array and reference paths. Such current change in turn will cause a change in signal, i.e., voltage at both the array and reference nodes. However, the change in signal at these nodes will be different due to the differences in the impedances of M1 and M2. For example, an increase in both currents will cause a larger voltage drop across the array path than across the reference path causing, thus, the array node voltage to drop more than the reference node voltage. As explained above, the reason is that a change in current in the reference path is not going to pull down the REF node as much as the current change would pull down the IN node in the array path because M2 is less resistive than M1. In sum, due to the asymmetrical design of the load devices, two contradictory events related to the noise are happening: the reference path couples more to $V_{CC}$ and less to $V_{SS}$; the array path will couple less to $V_{CC}$ and more to $V_{SS}$.

FIG. 2 illustrates a wave form diagram showing the effect of noise upon the output signal of the prior art sense amplifier. The diagram 2–1 of FIG. 2 illustrates the input IN and reference REF wave form signals to the differential stage and the output signal OUT of the sense amplifier in the absence of noise. As one can see, the reference signal tracks the array signal, the difference between these signals remaining stable. Upon a change of address illustrated in FIG. 2 by the wave form A's abrupt descent, the array node voltage rises up and crosses the reference signal causing a sense amplifier transition. Before the transition, the array signal is lower than the reference signal, and the sense amplifier output signal is high. When the array voltage signal rises above the reference signal, the sense output signal transitions from high to low.

FIG. 2—2 shows the same prior art wave form diagram, at the same time scale, with the exception that in this case, noise affects the supply voltage $V_{CC}$. As one can see in this figure, the impact of the noise at the $V_{CC}$ supply causes delay in the sense amplifier's response. As the $V_{CC}$ signal increases due to noise, the reference signal is pulled up, and the array signal is pulled down, the reference signal and the array signal track for approximately 5–10 nanoseconds. This difference in the voltage, seen at the array and reference nodes, generated by the noise event at $V_{CC}$ causes the crossing of the array signal and the reference signal to be delayed and, thus, the transition of the output OUT of the sense amplifier occurs later. The net result is that the sense amplifier's output response is pushed out by approximately 3 nanoseconds.

One prior art design, conceived to improve in part the above-discussed noise problems, consists in increasing the current gain on the reference side. This can be done by increasing the cascode device in the reference path. A change in size of the cascode device, however, can cause major process, current, and voltage differences between the array side and the reference side. These changes make it very difficult to maximize noise margin, speed balancing, and reference effects across process, voltage, and temperature corners. Consequently, there is a continuing need for improving the common mode noise rejection in pseudo-differential sense amplifiers while maintaining symmetry in the array and reference path, thereby maximizing noise margin, speed balancing, and reference effects across process, voltage, and temperature corners.

SUMMARY OF THE INVENTION

An apparatus and method are disclosed which overcome the disadvantages and limitations associated with prior art differential sense amplifiers. Such disadvantages and limitations include delays in the output of the sense amplifier caused by a noise event at the supply voltage, the delays causing a slower reading of a memory cell connected to the sense amplifier via an array path.

The invention provides a pseudo-differential sense amplifier with improved common noise rejection for reading in a speedier way a memory cell connected to the sense amplifier via an array path. The pseudo-differential sense amplifier possesses increased noise immunity and maintains the desired symmetry between a reference path and an array path of the pseudo-differential sense amplifier.

The pseudo-differential sense amplifier, with improved common noise rejection, generates an output signal indicative of the state of a memory cell connected to the sense amplifier via an array path. The sense amplifier includes a reference path and a differential stage having first and second inputs and an output which generates an output signal indicative of the content of the memory cell. The pseudo-differential sense amplifier further includes a reference load device for connecting the reference path to a supply voltage via a reference node, the reference node being connected to the first input of the differential stage. The sense amplifier further includes an array load device for connecting the array path to the supply voltage via an array node, the array node being connected to the second input of the differential stage. The sense amplifier further includes a balancing device, coupled to the reference node, the balancing device compensating a change in signal at the array node relative to the reference node, thereby reducing a push out of the output signal generated at the output of the differential stage wherein the push out is caused by the change in signal.

In one presently preferred manifestation of the present invention, which by no means limits the scope of the present invention, the pseudo-differential sense amplifier has a reference load device and an array load device which can be, but are not limited to, P-MOS transistors having their gates connected to the drains and the sources connected to the same supply voltage VCC. The P-MOS load devices are matched in size such that the impedance of the reference load measures, but is not limited to, approximately half the impedance of the array load. Furthermore, the balancing device in this embodiment is a capacitor which has a first terminal connected to the reference node and a second terminal connected to VSS or ground.

In another embodiment, similar to the above-described embodiment containing the capacitor, the balancing device includes a first and a second capacitor which are connected at one terminal to the reference node and at a second terminal to the substrate and to $V_{SS}$, respectively. A similar embodiment could be configured with the first capacitor connected to the substrate, the second capacitor connected to $V_{SS}$, and a third capacitor connected to $V_{CC}$.

Yet, in another embodiment, the pseudo-differential sense amplifier includes substantially identical P-MOS transistors acting as loads, these transistors having the drain and gate coupled to the array node and to the reference node respectively. In this embodiment the balancing device includes a current mirror device which is connected between the reference node and the array node. The current mirror device includes, but is not limited to, the first P-MOS transistor and a third P-MOS transistor, the third P-MOS transistor being coupled to the supply voltage at sources, and to the array node at its gate, and to the reference node at the drain. In this embodiment the current mirror provides for double input voltage swing. This is accomplished by having the current difference between the array cell and the reference cell pass through the reference load.

In another embodiment, the balancing device includes a current mirror device which consists of a first and a second current mirrors for mirroring a portion of the current of the reference path onto the array path. In this embodiment the first current mirror is coupled to the reference node and is comprised of the reference load device, which in this embodiment is, but is not limited to, a P-MOS transistor having the gate and drain connected to the gate of a third P-MOS transistor. The second current mirror comprises fourth, fifth, and sixth NMOS transistors, the impedance of the fourth transistor being substantially equal with half the impedance of the fifth transistor, the drain of the fourth transistor being coupled to the drain of the third transistor and to the gate of the sixth transistor, the gates of the fourth and fifth transistors being coupled to the drain of the fifth and to the source of the sixth transistor, and the drain of the sixth transistor being coupled to the array path via a data read array node (DRA).

BRIEF DESCRIPTION OF THE DRAWINGS

The above and other objects, features and advantages of the present invention will be apparent from the following detailed description of the invention explained with reference to the accompanying drawings, in which:

FIG. 2-1 illustrates a waveform chart depicting the operation of the conventional sense amplifier in the absence of noise;

FIG. 2—2 illustrates a waveform chart depicting the operation of the conventional sense amplifier when noise affects the supply voltage;

FIG. 4-1 illustrates a waveform chart depicting the prior art sense amplifier when the noise affects VCC.

FIG. 4-2 illustrates a waveform chart depicting the operation of the preferred embodiment of the sense amplifier.

FIG. 8 illustrates a waveform chart depicting the operation of the third embodiment with and without noise.

DETAILED DESCRIPTION OF THE INVENTION

The invention is described in greater detail hereinafter, by way of example only, with reference to a preferred embodiment thereof. In the following description, numerous specific details are set forth such as examples of voltages and particular transistor configurations, etc. in order to provide a thorough understanding of the present invention. It will be evident, however, to those skilled in the art that such specific details are not necessarily required in order to practice the invention. In other instances, well known structures and circuit not relating to the crux of the invention have been omitted or simplified in order to avoid unnecessarily obscuring the invention.

Figure 3:
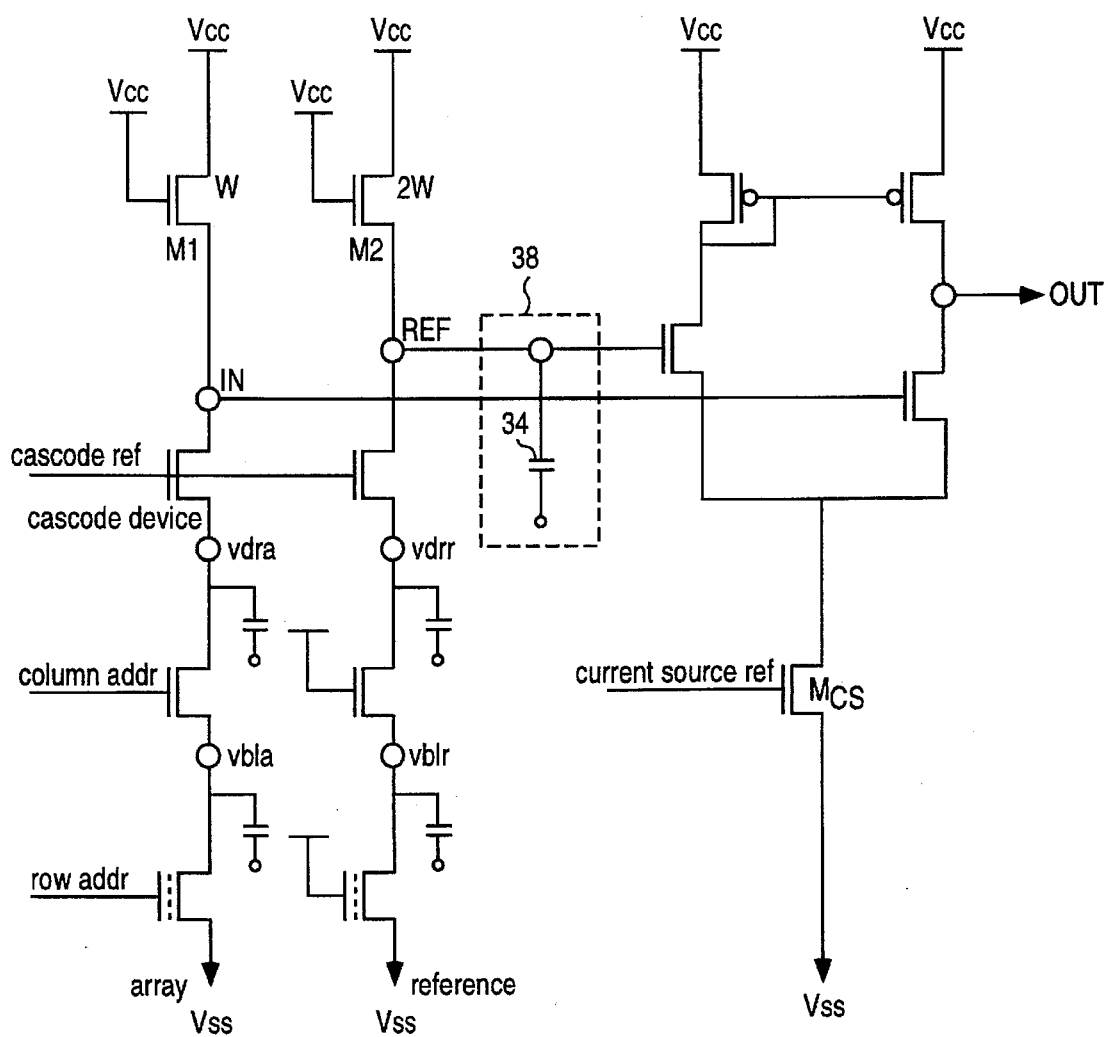
FIG. 3 illustrates a preferred embodiment of the sense amplifier according to the present invention.

FIG. 3 illustrates one embodiment of the pseudo-differential sense amplifier with improved common mode noise rejection. The embodiment illustrated in this figure incorporates, in part, by reference the structure of the embodiment illustrated in FIG. 1 and described in the "Background of the Invention." This figure shows balancing device 38 connected to the reference node REF of the reference. The balancing device is sized so that it will compensate a change in signal at the array node relative to the reference node. By way of non-limiting example, the change in signal at the array node can be caused by a gain difference between the array path and the reference path due to the lower impedance of the reference load device $M_2$ relative to the impedance of the array load device $M_1$. In a more particular, but non-limiting, embodiment illustrated in FIG. 3, the balancing device is a capacitor 34 coupled to the reference node at a first terminal and to VSS or ground at a second terminal. This capacitor increases the $V_{SS}$ coupling to the reference node and decreases the $V_{CC}$ coupling to the reference node.

This figure shows, by way of non-limiting example, reference load device having a width 2W as opposed to the width of the array load device W. While this Figure shows the array and reference load devices as being MOS transistors, these load devices are not limited to MOS transistors, and they can be implemented with other types of devices that serve the role of loads for the circuits described in this Figure. Furthermore, the length of the channels of the load devices illustrated in FIG. 3 is assumed to be substantially identical, although the present invention could be implemented with load devices having channels of different lengths.

In the description that follows, it is assumed that the load devices are implemented with P-MOS transistors having channels with substantially the same length and the widths of the reference load channel being approximately twice the width of the array load device channel. However, the following description should not be viewed as limiting the scope of the present invention.

To solve the problem posed by the asymmetrical design of the load devices mentioned in the "Background of the Invention," a balancing device means, or a capacitor in the more particular embodiment of FIG. 3, has been connected to the reference node. The addition of a capacitor to the array path would have been a less desirable alternative because such capacitor would have slowed down the response of the sense amplifier during a transition. However, since the reference path maintains a steady state, adding a capacitor between the reference node and $V_{SS}$ will not affect the speed of the sense amplifier. By connecting the capacitor C as in the embodiment of FIG. 3, the performance of the sense amplifier is improved in two ways: the reference path couples less to $V_{CC}$ because C holds the reference node towards $V_{SS}$; and the reference path will couple more to $V_{SS}$ because the capacitor is going to help pull the reference node to $V_{SS}$. In sum, by adding the capacitor to the reference path, the difference in voltage drop between the array node and the reference node will decrease, as the reference node will not be as "tightly" coupled to $V_{CC}$ and not as "remotely" coupled to $V_{SS}$ as in the prior art embodiments.

For technologies using grounded substrate, the bulk is connected to $V_{SS}$. The capacitor can be easily adjusted in silicon, the capacitor being connected at one terminal to $V_{SS}$. In the case of back bias technology, the bulk would be separated from $V_{SS}$, and thus two capacitors, $C_1$ and $C_2$, would be needed—one capacitor connected to the substrate and the second one connected to $V_{SS}$. The ratio of $C_1$ to $C_2$ would need to reflect the amount of miscoupling caused by each of the respective supplies. A third capacitor, connected to the reference node at one terminal and to $V_{CC}$ at another terminal may be used to stabilize the reference node.

Figure 1:
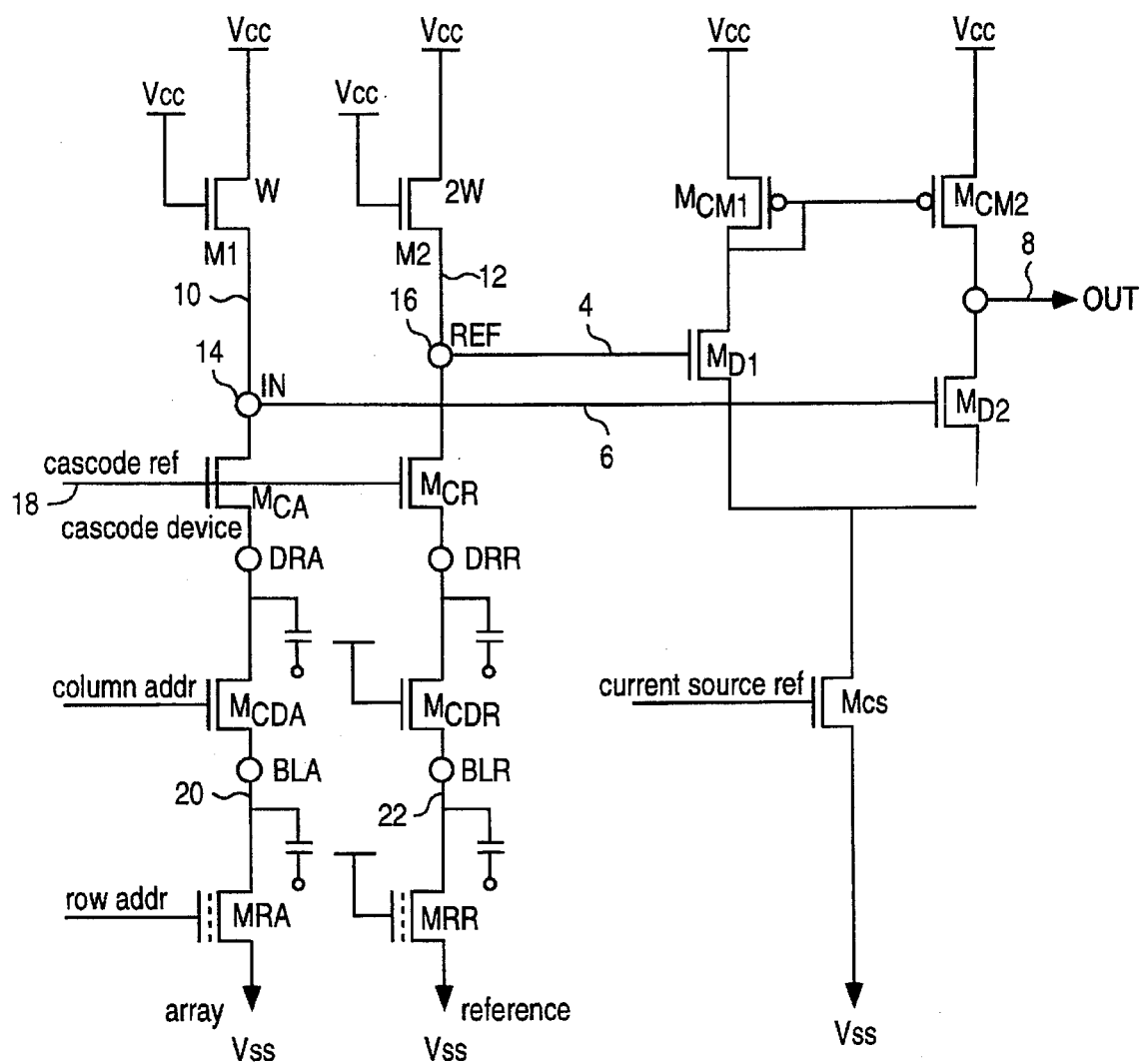
FIG. 1 illustrates a conventional pseudo-differential sense amplifier.
Figures 1, 4:
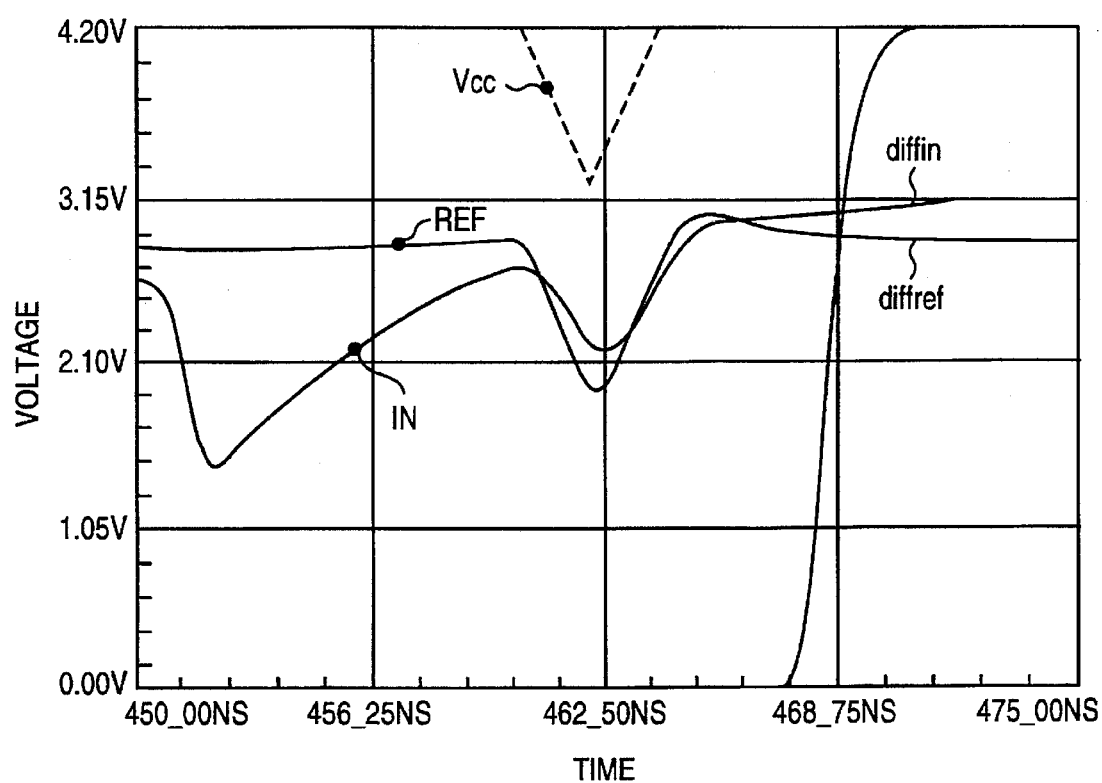
Figures 2, 4:
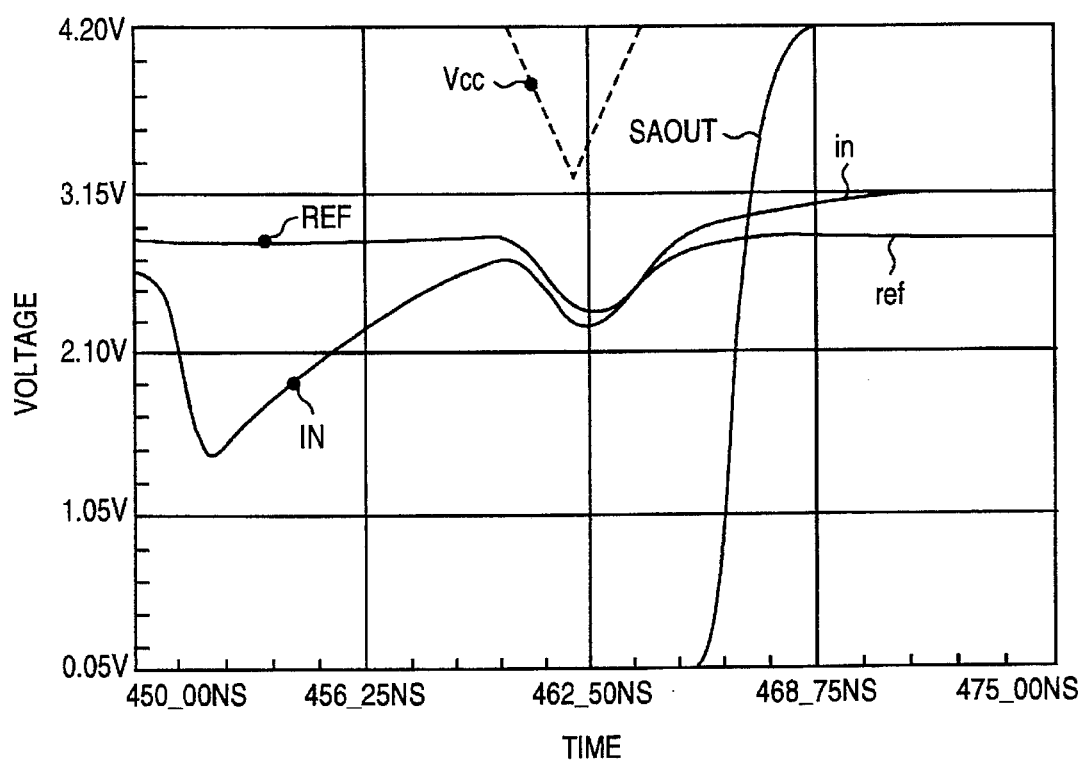

FIG. 4-1 shows a waveform depicting the output of the prior art pseudo-differential sense amplifier.

Figures 1, 2:
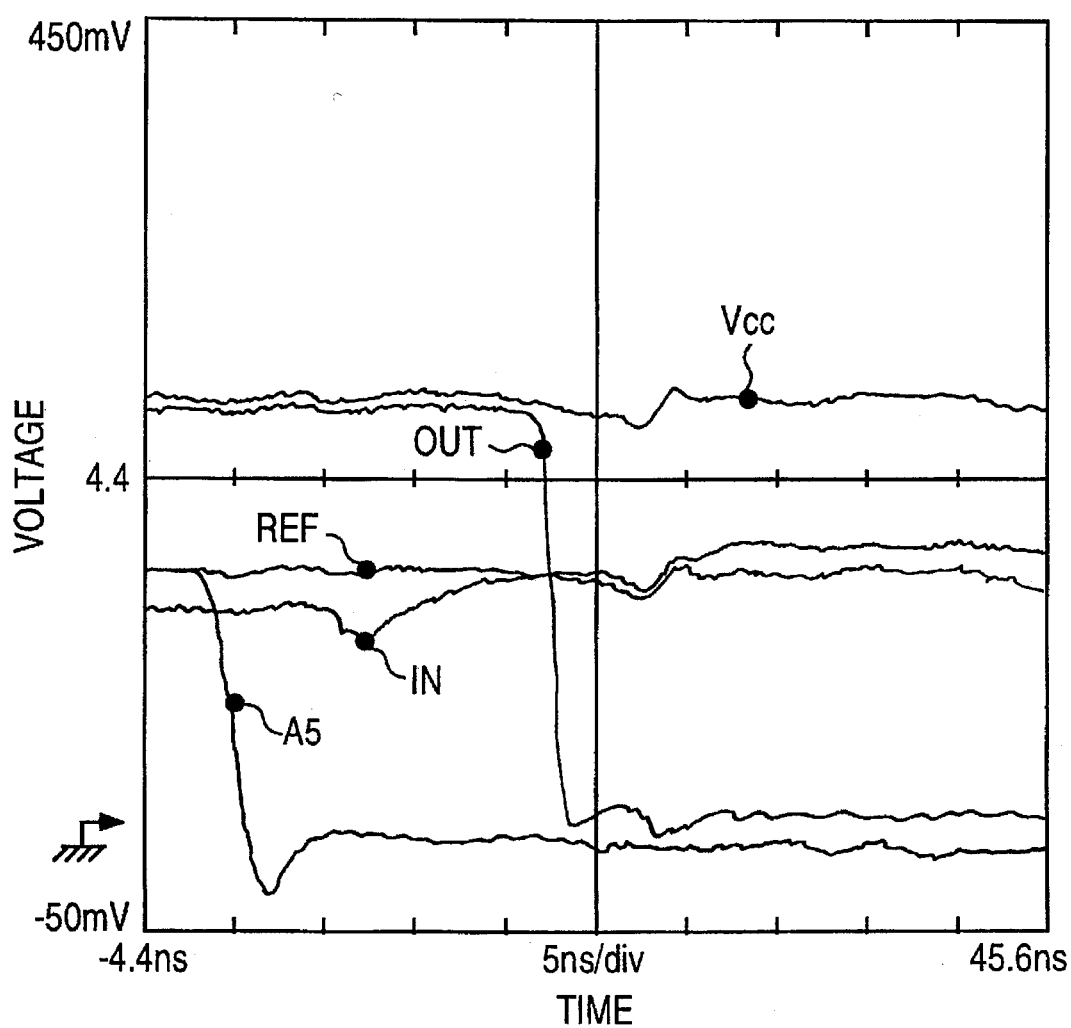
Figure 2:
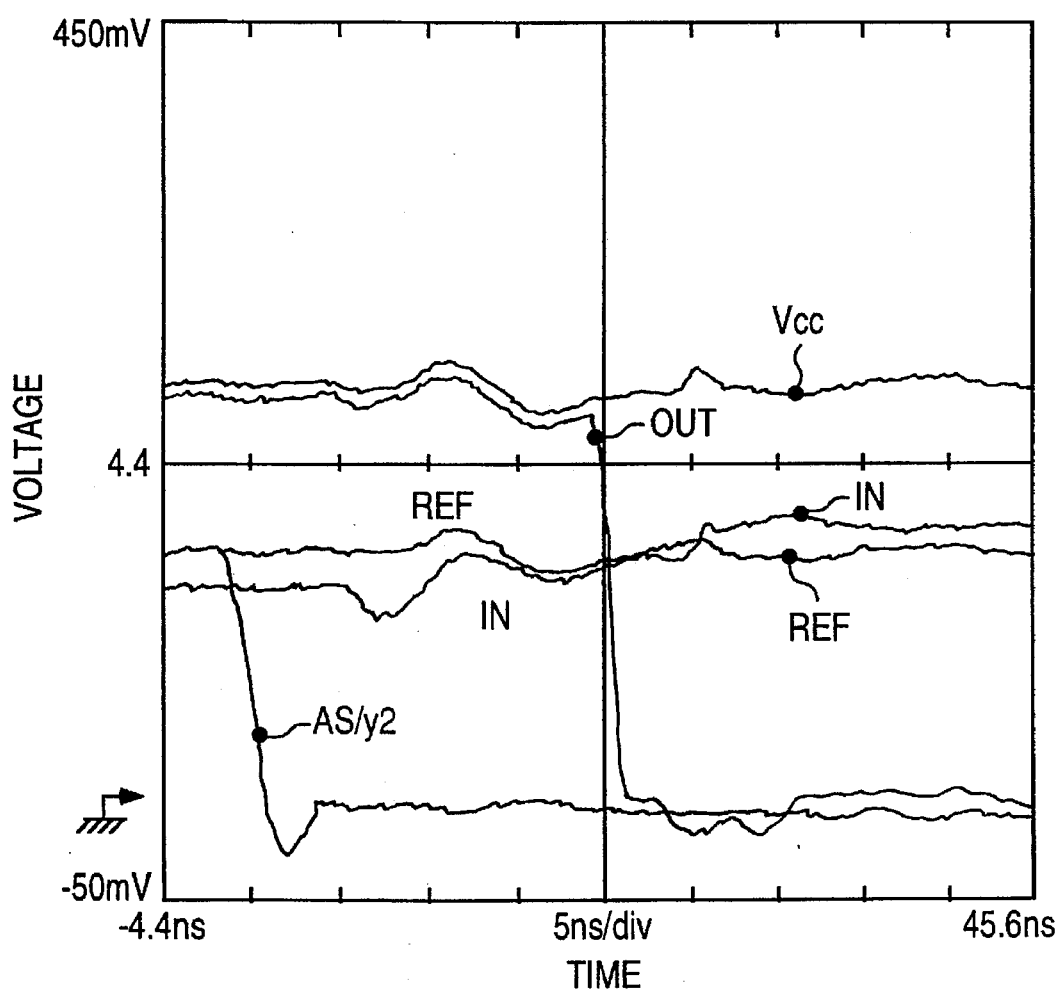

FIG. 4-2 shows the response of the pseudo-differential sense amplifier having a capacitor connected to the REF node. These figures show that the pseudo-differential sense amplifier according to the present invention responds to a transition of the memory cell faster than the prior art pseudo-differential amplifier when the same noise event affects the supply voltage $V_{CC}$.

Figure 5:
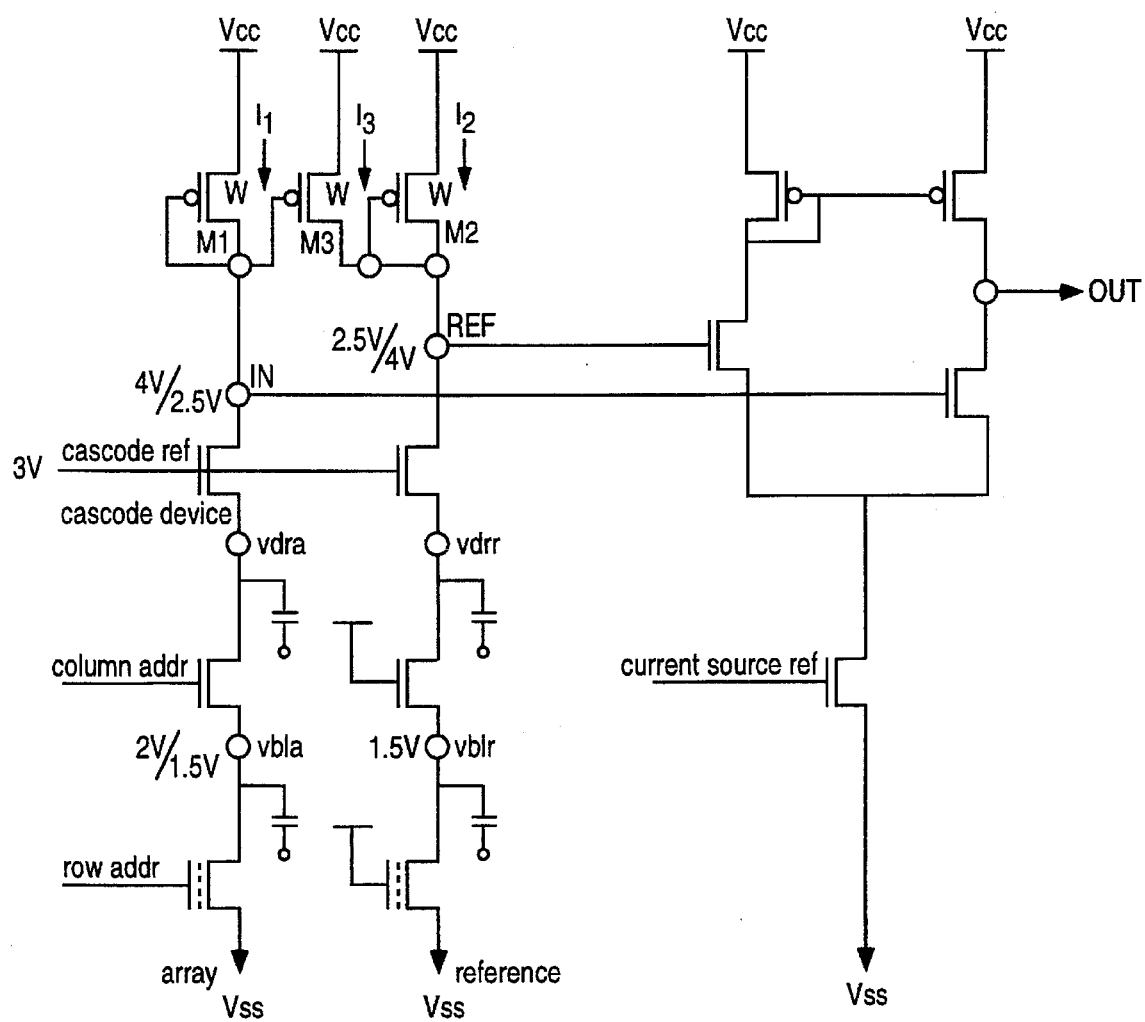
FIG. 5 illustrates a second embodiment of the sense amplifier according to the present invention.

FIG. 5 illustrates a second embodiment of the present invention. In this embodiment the balancing device is coupled, between the reference node REF terminal and the array node IN. Additionally, the array load device and the reference load devices M1 and M2 have substantially equal impedances, thereby conferring the sense amplifier the desired symmetry conducive to the array and reference nodes tracking noise well. As the array and reference load devices have substantially equal impedances the behavior of the sense amplifier towards noise events will improve, because the array side and the reference side will have approximately the same current gain. Furthermore, the addition of the balancing device between the array node and the reference node allows "centering" the voltage of the reference node between the high and the low voltage values seen at the array node.

In the particular embodiment of FIG. 5 the balancing device includes a current mirror device for mirroring a portion of the current of the array path onto the reference path. The current mirror device illustrated in FIG. 5 includes the array load device M1, connected at its drain to the gate of an additional P-MOS transistor M3. The array load device M1 is configured in the same manner as in the previous embodiment, having the drain and the gate coupled together, the transistor M3 having its gate coupled to the drain of transistor M1 and its drain coupled to the reference node. The reference voltage at the reference node is determined by the current difference between the array cell current $I_{array}$ cell and the reference cell current $I_{referencecell}$.

The reference cell is permanently kept in a "not programmed" state. For the case where the array cell is programmed, this cell will not conduct a substantial current and therefore, no current will be flowing through the array load M1. The voltage seen at the IN node will be high. Because no current is flowing through M1 no current is flowing through M3 and all the reference current is flowing through the reference load causing node REF to be low. For a cell in a "not programmed" state, the current will be flowing through the array load M1 which causes the IN mode to be low, and because some current is flowing through M1, some or all of the reference current will flow through M3 instead of the reference load M2. This will cause the REF node to be high.

In the case where both paths are conducting, M1 and M3 act as a current mirror. A current substantially equal with the current running through M1 will run through transistor M3. The current mirror ratio does not have to be 1:1, but can be slightly less. In the current mirror device, the transistor M1 is the master and transistor M3 is the slave. By way of non-limiting example, it is assumed that in this particular embodiment, the current flowing through transistor M1 is reflected to transistor M3 in a one-to-one ratio. Generally, in a current mirror configuration, the master is forced into the saturation region, and the slave has the same gate to source voltage as the master so that the current flowing through the slave will be a proportion of the current flowing through the master as determined by the gain ratio of the master and the slave so long as there is no other mechanism operating to limit the current below what is established by the gain ratios.

In FIG. 5, transistor M1 supplies current to the array path, this current being determined by the conductivity of the memory cell transistor and the voltage limiting effect of the cascode reference voltage. Similarly transistors M2 and M3 supply current to the reference path. The current supplied via transistor M2 and M3 to the reference path is determined by the voltage limiting effect of the cascode reference voltage and the conductivity of the reference memory cell, which in the present embodiment is fixed to a steady state. Both M2 and M3 supply current to the reference cell. Due to the gate to drain diode connection for both M1 and M2, the amount of current flowing through these devices drastically effects the drain voltage. On the other hand, transistor M3's gate is independent of its drain, and because it mainly operates in the saturation region the amount of current flowing through this device is almost independent of the drain voltage. When array cell is not programmed, transistor M1 has the array cell current flowing through it. The flow of current through M1 pushes the node IN low. The sum of the current through M2 and M3 is equal to the reference cell current. The amount of current through M3 is proportional or equal to the amount of current through Mi. Therefore the amount of current flowing through M2 is roughly equal to the reference cell current minus the array cell current. Because the current in M3 is independent of the drain voltage coupled to REF, the REF node's voltage is set by the current in M2.

For the case in which the selected array memory cell is in the high threshold voltage state, the conductivity of the selected array memory cell is much lower than the conductivity of the selected reference memory cell. With the conductivity substantially reduced for the programmed state, the current in the array path is substantially reduced in comparison to the current in the reference path where the conductivity of the reference memory cell is much higher. Typically, the conductivity of transistor M1 will be at least ten times less for the programmed state than for the "not-programmed" state. In this state, the voltage at the array node will increase, and the current $I_2$ going through the transistor M2 will be equal to the current going through the reference cell minus the current going through the array cells. $I_2 = I_{REFERENCE\ CELL} - I_{ARRAY\ CELL}$. In other words, the less current going through the array cell, the more current will go through transistor M2 and thus the reference node voltage will be pulled down. If the array cell is programmed, then all of the reference current will flow through M2.

Besides improving the common mode noise rejection, this configuration is a new type of sense amplifier. This sense amplifier provides for reduced bit-line swing and double cascode voltage swing because the reference node inversely tracks changes in signal at the array node. As density and speed increases, reducing bit line swing is an important objective for making sense amplifier faster and obtaining higher performance. A major portion of the delay associated to sensing a memory cell is the time required for the memory cell and sense amplifier to change and discharge the bit—the bit line swing. A smaller swing allows for more load and/or higher capacity. Consequently, the cascode swing and the noise margin for a fixed bit line swing is doubled in this configuration. A smaller bit line swing will improve considerably the speed of the sense amplifier.

To summarize, when the array path is conducting, M3 will mirror the current of the array path to the reference path according to the equation $I_3 = I_{ARRAY\ CELL} = I_{REFERENCE\ CELL} - I_2$. According to this equation, when M1 conducts heavily, the array node voltage will be pulled down, M3 will mirror the current of the array path to the reference path, and the current through transistor M2 will be practically zero. This in turn will cause the voltage at the reference node to be pulled up. In the contrary case where M1 will not conduct the voltage at the array node is pulled up, the transistor M3 will not pull a lot of current and most of the current going through the reference path will be pulled through transistor M2 which will cause the reference node REF to go down. FIG. 5 shows, numerically, the approximate values of voltages at the nodes of the device.

With respect to M1 and M2, these devices do not act as perfect resistors. As soon as the array and reference voltage signals have already started to cross, there will be more current on one path than on the other path and, thus, different noise tracking will occur. However, it is possible to achieve substantially the same noise tracking when M1 and M2 are exactly equal. With respect to transistor M3, this device is less affected by noise from the supply voltage than M1 and M2 because this device has a much higher impedance as opposed to M1 and M2 which are connected as diodes.

Figure 6:
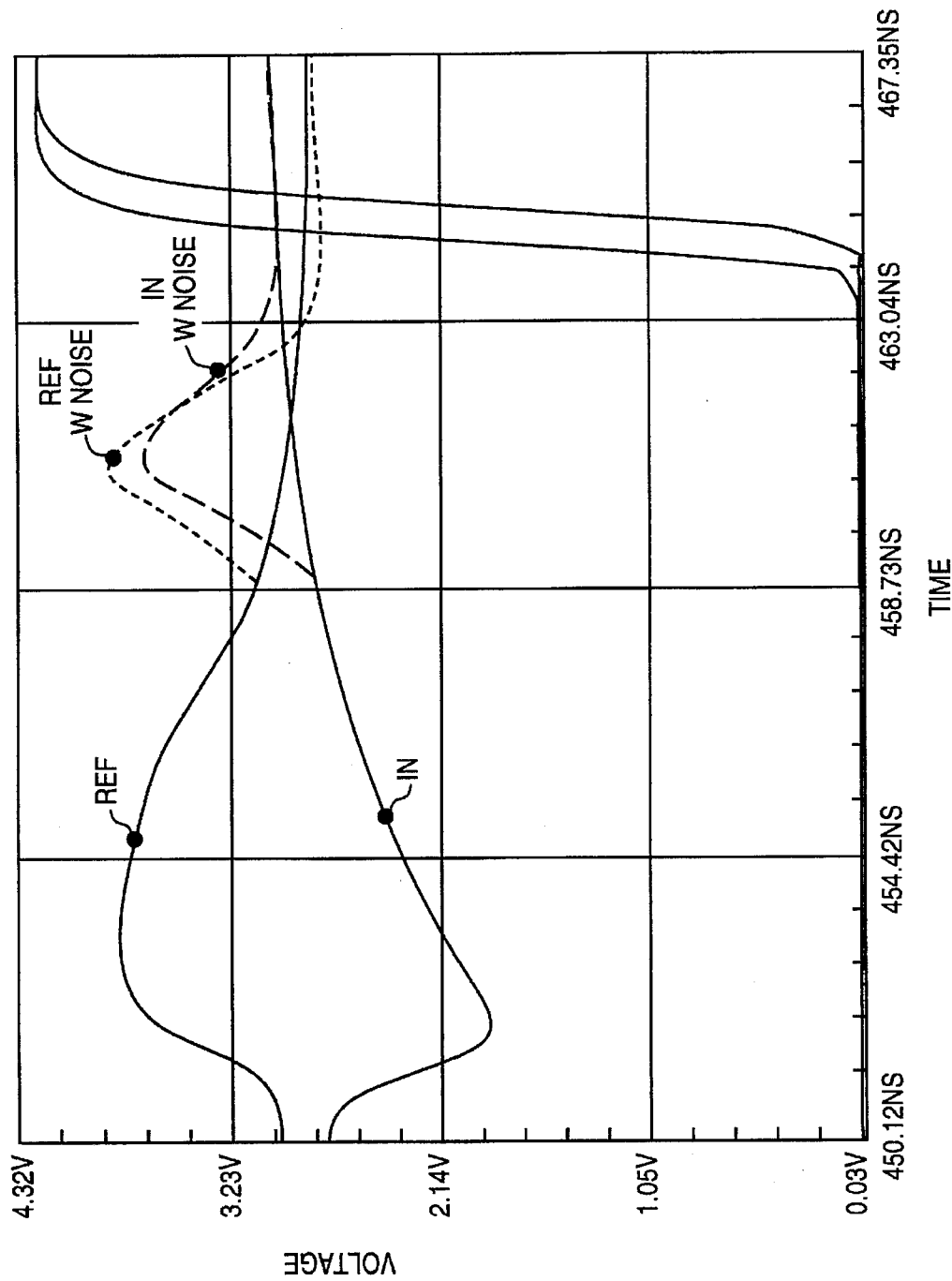
FIG. 6 illustrates a waveform chart depicting the operation of the second embodiment with and without noise.

FIG. 6 shows the reference and array wave form signals, the array signal being lower than the reference signal. A noise event at VCC will cause a push-out of approximately ½ ns at the output of the differential stage upon a transition of the sense amplifier due to a change state of in the memory cell. The diagram shows that the reference path couples more to $V_{CC}$ than the array path. The two smooth lines that are crossing represent the wave form signals without any type of noise. While the crossing point between the dotted lines is almost the same, some push-out can be observed at the output of the sense amplifier.

Figure 7:
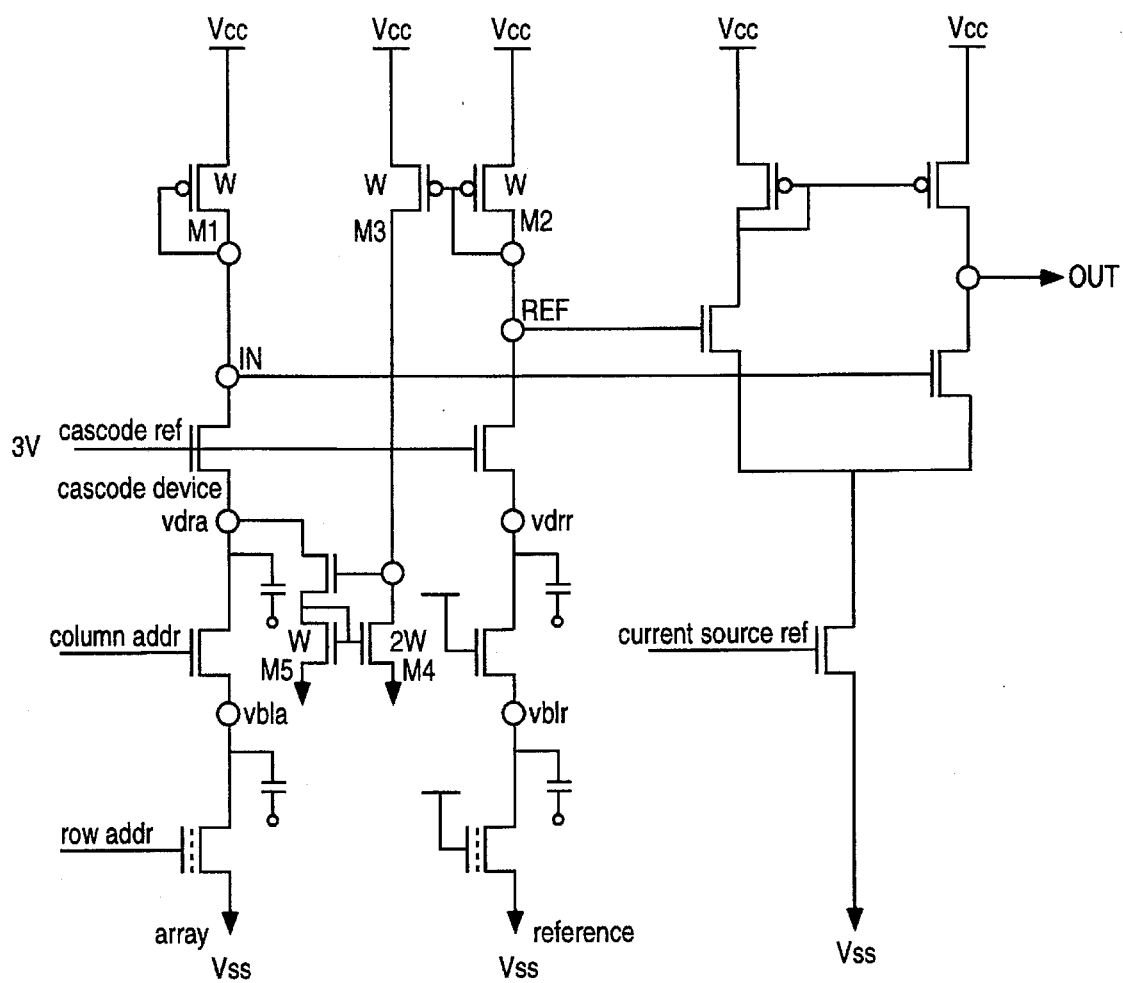
FIG. 7 illustrates a third embodiment of the sense amplifier according to the present invention.

FIG. 7 illustrates a third embodiment of the present invention. This embodiment includes a first current mirror and a second current mirror. The first current mirror is connected to the reference node at one terminal and to the second current mirror at a second terminal. The second current mirror is connected to the node DRA of the array path. In this embodiment, load devices M1 and M2 are designed to have substantially the same impedance, thus causing the array side and the reference side to be symmetrical and, therefore, to track noise well. The first current mirror includes transistors M2 and M3, where M2 is a P-MOS transistor having its gate and drain coupled to the reference node and to the gate of P-MOS transistor M3. The drain of transistor M3 is connected to the second current mirror. The second current mirror includes N-MOS transistors, M4, M5, and M6. In the specific embodiment illustrated in FIG. 6, the second current mirror is an N-MOS Wilson current mirror with transistor M4 having the drain connected to the drain of M3 and to the gate of transistor M6. Furthermore, transistor M4 is designed to have a channel with a width substantially twice the width of the other transistors M5 and M6. The gate of transistor M4 is connected to the gate of transistor M5, to the drain of transistor M5, and to the source of transistor M6. The second current mirror is connected to the array path at the node DRA via the drain of transistor M6. The effect of this configuration is to add approximately half of the reference cell current to the array cell current. Assuming that the voltage at the reference node is set by a reference current $I_{REF}$, the array current will swing between 1/2 $I_{REF}$ and 3/2 $I_{REF}$. In the case the array path is not conducting the current flowing through the array path will be 1/2 $I_{REF}$. In the case where the array path is conducting, 3/2 $I_{REF}$ will flow through the array path. This embodiment is directed towards using substantially identical load devices so that good noise tracking is obtained, and towards maintaining the reference node's voltage in the middle of the high level and the low level.

The capacitances on the array side shown in FIGS. 1, 3, 5, and 7 are parasitic. The capacitances on the reference path, however, could be either parasitic or real, depending on how closely the reference and the array path are matched. The supply sources connected to the gates of the transistors in the reference path can either be connected to VCC directly or indirectly through an inverter. The inverter will resistively connect the supply source to the gate in the reference path so that during a noise event the reference path will behave like the array path. With respect to the load devices M1 and M2, these devices are not limited to transistors—they can be active or passive loads.

Listed below is a non-limiting example of relative sizes of some of the transistors width-to-length for the sense amplifier circuits illustrated in FIGS. 3, 5, and 7.

| Cascode transistors (W/L) | 124 2*32.5/1 | 154 2*32.5/1 | 125 2*10/1 | 155 2*10/1 |
| --- | --- | --- | --- | --- |
| PMOS loads (W/L) | 122 6/1 | 152 12.3/1 | 123 4.4/1 | 153 8.6/1 |
| Differential transistors (W/L) | 200 35/0.8 | 210 35/0.8 | | |
| Differential loads (W/L) | 202 4*11.25/0.8 | 212 4*11.25/0.8 | | |
| Current source transistor (W/L) | 220 30/1.6 | | | |
| Output transistor (W/L) | 230 25/0.8 | 232 7.5/0.8 | | |

What is claimed is:

1. A pseudo-differential sense amplifier, for generating an output signal indicative of the state of an array memory cell connected to the sense amplifier via an array path, said sense amplifier comprising:

a differential stage having first and second inputs and an output;

a reference path;

a reference load device for connecting said reference path to a supply voltage via a reference node, said reference node being connected to said first input of said differential stage;

an array load device for connecting said array path to a supply voltage via an array node, said array node being connected to said second input of said differential stage, and said array path and said reference math being coupled to a second voltage; and balancing device coupled to the reference node, said balancing device decoupling said reference path from said supply voltage relative to said second voltage.

2. The pseudo-differential sense amplifier of claim 1 wherein said change in signal is caused by a noise event at said supply voltage.

3. The pseudo-differential sense amplifier of claim 2 wherein the memory cell comprises a non-volatile memory cell.

4. The pseudo-differential sense amplifier of claim 3 wherein said array and reference load devices comprise MOS transistors.

5. The pseudo-differential sense amplifier of claim 4 wherein said array and reference load devices are matched in size with the impedances of said array and reference paths such that the voltage difference between the array node and the reference node will fall within a voltage predetermined range.

6. The pseudo-differential sense amplifier of claim 5 wherein the impedances of said array and reference paths are substantially equal and said reference load device has an impedance with a value smaller than the value of the impedance of said array load device.

7. The pseudo differential amplifier of claim 5 wherein said voltage predetermined range is approximately half the difference between a high voltage and a low voltage measured at said array node.

8. The pseudo differential amplifier of claim 7 wherein said high voltage is approximately 4 volts and said low voltage is approximately 2.5 volts.

9. The pseudo-differential sense amplifier of claim 1 wherein said balancing device comprises a capacitor.

10. The pseudo-differential sense amplifier of claim 9 wherein said array memory cell is a non-volatile memory cell, said change in signal is caused by a noise event at said supply voltage, the impedances of said array and reference paths are substantially equal, the reference load device has an impedance measuring approximately half the impedance of said array load device, and said capacitor has a first terminal connected to said reference node and a second terminal connected to a voltage bias source.

11. The pseudo-differential sense amplifier of claim 1 wherein said array memory cell is a non-volatile memory cell, said change in signal is caused by a noise event at said supply voltage, the impedances of said array and reference paths are substantially equal, the reference load device has an impedance measuring approximately half the impedance of said array load device, and said balancing device comprises first and second capacitors having first and second terminals, said first terminal of said first and second capacitors being connected to said reference node, said second terminal of said first and second capacitors being connected respectively to a substrate and to a voltage bias source.

12. The pseudo-differential sense amplifier of claim 1 wherein said array memory cell is a non-volatile memory cell, said change in signal is caused by a noise event at said supply voltage, the impedances of said array and reference paths are substantially equal, and the reference load has an impedance of approximately half the impedance of said array load, and said balancing means comprises first, second and third capacitors having first and second terminals, said first terminal of said first, second, and third capacitors being connected to said reference node, said second terminal of said first, second, and third capacitors being connected respectively to a substrate, to $V_{SS}$, and to $V_{CC}$.

13. The pseudo-differential sense amplifier of claim 1 wherein said change in signal is caused by a noise event at said supply voltage, said array memory cell is a non-volatile memory cell, and said array and reference load devices comprise, respectively, substantially identical first and second P-MOS transistors having their sources coupled to said supply voltage, said first transistor having the drain and gate coupled to the array node, said second transistor having the drain and gate coupled to the reference node.

14. The pseudo-differential sense amplifier of claim 13 wherein said balancing device comprises a current mirror device coupled between the reference node and the array path.

15. The pseudo-differential sense amplifier of claim 13 wherein said current mirror device comprises said first P-MOS transistor and a third P-MOS transistor said third transistor being coupled, at the gate thereof to the array node, at the drain thereof to the reference node, and at the source thereof to the supply voltage.

16. The pseudo-differential sense amplifier of claim 14 wherein said current mirror device comprises first and second current mirrors for mirroring a portion of the current of the reference path onto said array path.

17. The pseudo-differential sense amplifier of claim 16 wherein said first current mirror comprises second and third substantially identical P-MOS transistors and said second current mirror comprises fourth, fifth, and sixth N-MOS transistors, the impedance of the fourth transistor being approximately half the impedance of the fifth transistor, the gate of said second transistor being coupled to the gate of said third transistor, the drain of the third transistor being coupled to the drain of the fourth transistor and to the gate of said sixth transistor, the gates of said fourth and fifth transistors being coupled to the drain of the fifth and to the source of the sixth transistor, the drain of the sixth transistor being connected to said array path via a data read array (DRA) node.

18. The pseudo-differential sense amplifier of claim 1 wherein said array memory cell is a floating gate device, said change in signal is caused by a noise event at said supply voltage, the reference load device has an impedance of approximately half the impedance of said array load device, said balancing device is a capacitor having a first terminal connected to said reference node and a second terminal connected to a voltage bias source, said floating gate device is connected to an array of columns and rows of memory cells selectively addressable through array row lines and array bit lines, said array memory cell being further connected to the array path via an array bit line, said array path comprising an array cascode amplification device coupled to the array bit line and to the array load device, and said reference node is coupled via a reference cascode amplification device to a dummy reference memory cell substantially identical with said floating gate device.

19. The pseudo-differential sense amplifier of claim 1 wherein said array memory cell is a floating gate device, said change in signal is caused by a noise event at said supply voltage, the impedances of said array and reference paths are substantially equal, the reference load device has an impedance substantially equal with the impedance of said array load device, said balancing device is a current mirror having a first terminal coupled to said reference node and a second terminal coupled to said array path, said array memory cell is connected to an array of columns and rows of memory cells selectively addressable through array row lines and array bit lines, said array memory cell being further connected to the array path via an array bit line, said array path comprising array cascode amplification device coupled to the array bit line and to the array load, and said reference node is coupled via reference cascode amplification device to a reference dummy memory cell substantially identical with said floating gate device.

20. A pseudo-differential sense amplifier with improved noise margin, for generating an output signal indicative of the state of a memory cell coupled to the sense amplifier via an array path, said sense amplifier including a reference path and a differential stage having first and second inputs and an output, said sense amplifier further comprising:

a reference load device for connecting said reference path to a supply voltage via a reference node, said reference node being connected to said first input of said differential stage;

an array load device for connecting said array path to a supply voltage via an array node, said array node being connected to said second input of said differential stage;

voltage-swing amplification device, connected between the reference and the array nodes, said voltage-swing amplification device inversely tracking to the reference node a change in signal at the array node relative to the reference node.

21. The pseudo-differential sense amplifier of claim 20 wherein the array and reference load devices comprise, respectively, substantially identical first and second P-MOS transistors, said first transistor having the drain and gate connected to the array node, said second transistors having the drain and gate connected to the reference node, said voltage-swing amplification device comprises a third P-MOS transistor, said third P-MOS transistor having the gate connected to the array node, the drain connected to the reference node, and the source connected to the supply voltage.

22. A method for sensing the state of an array memory cell thereby generating an output signal the method comprising the steps of:

connecting a memory cell of an array to a supply voltage via an array path, an array node, and an array load device in response to an array select signal;

connecting a balancing device to a supply voltage via a reference load device, said reference load device being coupled via a reference node to a reference path coupled to a conducting reference dummy memory cell;

developing a current through said array path responsive to the state of said array memory cell;

developing voltage values at the array node and at the reference node in accordance with the currents flowing through said, respectively, array and reference paths; and balancing the voltage at the reference node relative to a change in the voltage at the array node.

23. The method of claim 22 wherein said balancing device is a capacitor device.

24. The method of claim 22 wherein said balancing device is a current mirror device coupled to said reference node and to said array path.

25. The pseudo-differential sense amplifier of claim 1, wherein said balancing device comprises a current mirror device coupled between the reference node and the array path.

26. The pseudo-differential sense amplifier of claim 25, wherein said current mirror device supplies a portion of the current of the array path onto said reference path.

27. The pseudo-differential sense amplifier of claim 1, wherein the second voltage is one of a back bias and a substrate voltage and ground.

* * * * *